United States Patent
Oswal et al.

(10) Patent No.: US 10,911,161 B2
(45) Date of Patent: Feb. 2, 2021

(54) RF TRANSMITTER AND AUXILIARY RECEIVER TO CAPTURE TRANSMIT SIGNAL DATA TO COMPENSATE FOR TRANSMIT SIGNAL IMPAIRMENTS

(71) Applicant: TEXAS INSTRUMENTS INCORPORATED, Dallas, TX (US)

(72) Inventors: Sandeep Oswal, Bangalore (IN); Visvesvaraya Pentakota, Bangalore (IN); Jagannathan Venkataraman, Bangalore (IN); Jaiganesh Balakrishnan, Bangalore (IN); Francesco Dantoni, Rome (IT)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/697,236

(22) Filed: Nov. 27, 2019

(65) Prior Publication Data
US 2020/0177288 A1  Jun. 4, 2020

(30) Foreign Application Priority Data
Nov. 30, 2018 (IN) .............................. 201841045287

(51) Int. Cl.
*H04B 17/13* (2015.01)
*H04B 1/04* (2006.01)
*H04L 27/36* (2006.01)

(52) U.S. Cl.
CPC ............... *H04B 17/13* (2015.01); *H04B 1/04* (2013.01); *H04L 27/364* (2013.01); *H04B 2001/0408* (2013.01)

(58) Field of Classification Search
CPC .. H04B 17/13; H04B 1/04; H04B 2001/0408; H04L 27/364
See application file for complete search history.

(56) References Cited

U.S. PATENT DOCUMENTS

| | | | | |
|---|---|---|---|---|
| 2004/0208267 | A1* | 10/2004 | Lee ....................... | H04L 27/266 375/354 |
| 2008/0159418 | A1* | 7/2008 | Anderson ............. | H04L 27/364 375/260 |
| 2009/0252206 | A1* | 10/2009 | Rheinfelder ............. | H04B 1/40 375/219 |
| 2013/0208827 | A1* | 8/2013 | Muhammad .......... | H04L 27/367 375/297 |

(Continued)

*Primary Examiner* — Jean B Corrielus
(74) *Attorney, Agent, or Firm* — John R. Pessetto; Charles A. Brill; Frank D. Cimino

(57) ABSTRACT

A transmitter for an RF communications system, that includes an auxiliary receiver for capturing transmit signal data for use in compensating/correcting transmit signal impairments (such as for DPD, QMC, LOL). The transmitter (such as Zero IF) includes analog chain elements that introduce transmit signal impairments (such as PA nonlinearities). The auxiliary receiver is configured to receive loopback transmit RF signals, and includes an RF direct sampling ADC to convert the loopback transmit RF signals to digital transmit RF signals. Digital down conversion circuitry is configured to downconvert the digital transmit RF signals to captured digital transmit baseband signals, and data capture circuitry is configured to generate the transmit signal data based on the captured digital transmit baseband signals.

11 Claims, 2 Drawing Sheets

(56) References Cited

U.S. PATENT DOCUMENTS

2015/0092880 A1\* 4/2015 Johansson ............ H04B 1/0483
　　　　　　　　　　　　　　　　　　　　　　375/295
2015/0103952 A1\* 4/2015 Wang ........................ H03F 3/24
　　　　　　　　　　　　　　　　　　　　　　375/297

\* cited by examiner

RF TRANSMITTER AND AUXILIARY RECEIVER TO CAPTURE TRANSMIT SIGNAL DATA TO COMPENSATE FOR TRANSMIT SIGNAL IMPAIRMENTS

CROSS-REFERENCE TO RELATED APPLICATIONS

Priority is claimed under 37 CFR 1.78 and 35 USC 119(e) to INDIA Provisional Application 201841045287, filed 2018 Nov. 30, which is incorporated by reference in its entirety.

BACKGROUND

In RF transmitters/transceivers, an auxiliary receiver can be used to capture transmission signal data for use by the transmitter in correcting or compensating for transmit signal chain impairments. For example, the transmitter can be configured for DPD (digital pre-distortion) to linearize the transmitter power amplifier, increasing high power efficiency. The auxiliary receiver receives loopback transmit RF (PA output), which is converted by the auxiliary receiver signal chain back to a digital baseband to provide transmit signal data used to estimate PA nonlinearity, and adapt/adjust transmit DPD.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of the disclosed invention. RF transmitter and auxiliary receiver to capture transmit signal data to compensate for transmit signal impairments.

The Disclosure describes apparatus and methods for an RF transmitter and auxiliary receiver with RF (direct) sampling to capture transmit signal data to compensate/correct for transmit signal impairments (such as DPD compensation for PA nonlinearities, QMC compensation for IQ mismatch, and correction for LO leakage).

According to aspects of the Disclosure, a circuit for use in an RF (radio frequency) communications system includes a transmitter and an auxiliary receiver. The transmitter includes digital and analog signal chains, and is configured to output from the analog signal chain transmit RF signals based on digital baseband signals input from the digital signal chain. The transmitter further includes analog signal chain elements that introduce transmit signal impairments, and impairment compensation circuitry in the digital signal chain to compensate or correct for the transmit signal impairments and auxiliary receiver is configured to receive loopback transmit RF signals. The auxiliary receiver includes: an RF direct sampling ADC to convert the loopback transmit RF signals to digital transmit RF signals; digital down conversion circuitry to downconvert the digital transmit RF signals to captured digital transmit baseband signals; and data capture circuitry to generate the transmit signal data based on the captured digital transmit baseband signals.

According to other aspects of the Disclosure, a transceiver circuit for use in an RF (radio frequency) communications system includes a transmitter, an auxiliary receiver, and a (traffic) receiver. The transmitter includes digital and analog signal chains, and is configured to output from the analog signal chain transmit RF signals based on digital baseband signals input from the digital signal chain. The transmitter further includes analog signal chain elements that introduce transmit signal impairments, and impairment compensation circuitry in the digital signal chain to compensate or correct for the transmit signal impairments, based on transmit signal data derived from the transmit RF signals. The auxiliary receiver is configured to receive loopback transmit RF signals, and includes: an RF direct sampling ADC to convert the loopback transmit RF signals to digital transmit RF signals; digital down conversion circuitry to downconvert the digital transmit RF signals to captured digital transmit baseband signals; and data capture circuitry to generate the transmit signal data based on the captured digital transmit baseband signals. The receiver including analog and digital signal chains, and is configured to receive through the analog signal chain the loopback transmit RF signals, and to convert the received RF signals to digital baseband signals.

In other aspects of the Disclosure, a method for use in an RF (radio frequency) communications system, includes: generating transmit RF signals based on digital baseband signals, in a transmitter with digital and analog signal chains, the analog signal chain introducing transmit signal impairments; in the digital signal chain, compensating or correcting for the transmit signal impairments based on transmit signal data derived from the transmit RF signals; receiving loopback transmit RF signals in an auxiliary receiver, and then converting the loopback transmit RF signals to digital transmit RF signals in an RF direct sampling ADC, downconverting the digital transmit RF signals (digital down conversion) to captured digital transmit baseband signals, and generating the transmit signal data based on the captured digital transmit baseband signals.

Other aspects and features of the invention claimed in this Patent Document will be apparent to those skilled in the art from the following Disclosure.

DETAILED DESCRIPTION

Figure 1:
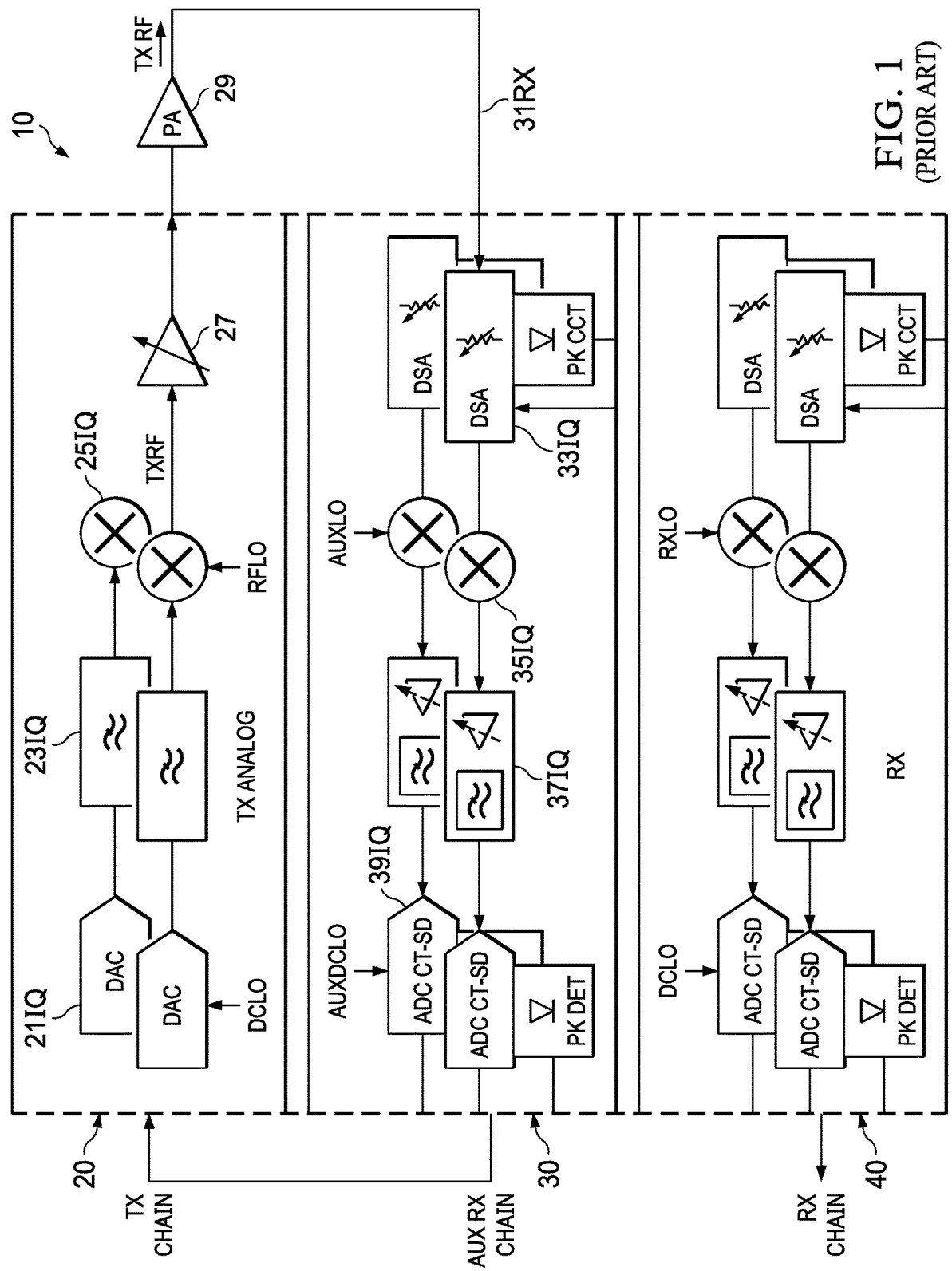
FIG. 1 illustrates an RF transceiver 10, including a transmitter 20, an auxiliary (feedback) receiver 30, and a (traffic) receiver 40.

This Description and the Drawings constitute a Disclosure, including design examples and implementations, and including illustrating various technical features and advantages for: an RF transmitter and auxiliary receiver with RF (direct) sampling to capture transmit signal data to compensate/correct for transmit signal impairments (such as DPD compensation for PA nonlinearities, QMC compensation for IQ mismatch, and LOL correction for LO leakage).

This Disclosure uses the following nomenclature: TX (transmitter); RX (receiver); TX/RX (transceiver); AUX RX (auxiliary receiver sometimes referred to as a feedback receiver FBRX); ADC (analog to digital converter); CT-SD (continuous time sigma delta), such as a CT-SD modulator or CT-SD ADC; DAC (digital to analog converter); PA (power amplifier); ZIF (zero intermediate frequency); LIF (low intermediate frequency); DSA (digital step attenuator);

SHA (sample and hold amplifier); LO (local oscillator); DDC (digital downconversion); NCO (numerically-controlled oscillator); IQ (in-phase, quadrature); MIMO (multiple input, multiple output). Transmit signal impairments can include: PA nonlinearities; IQ mismatch; and LO leakage or LOL. Transmit signal impairment compensation (or compensation/correction) can include: DPD (digital pre-distortion) to linearize the PA; QMC (quadrature mismatch compensation) to compensate for IQ mismatch; and LOL correction to correct for LO leakage.

In brief overview, a transmitter for an RF communications system includes an auxiliary receiver for capturing transmit signal data for use in compensating/correcting transmit signal impairments (such as for DPD, QMC, LOL). The transmitter (such as Zero IF) includes analog chain elements that introduce transmit signal impairments (such as PA nonlinearities). The auxiliary receiver is configured to receive loopback transmit RF signals, and includes an RF direct sampling ADC to convert the loopback transmit RF signals to digital transmit RF signals. Digital down conversion circuitry is configured to downconvert the digital transmit RF signals to captured digital transmit baseband signals, and data capture circuitry is configured to generate the transmit signal data based on the captured digital transmit baseband signals.

In a wireless communications infrastructure, base-station transceivers (TX/RX) commonly use an auxiliary receiver to capture transmit RF signal data for use by the transmitter to compensate or correct for transmission signal impairments (sometimes referred to as a feedback receiver). For example, DPD can be used in the TX signal chain to linearize the PA for high power efficiency. TX DPD typically results in a 3-5× bandwidth expansion (DPD expansion bandwidth).

For MIMO applications (for example, 64T64R), a ZIF TX architecture (including I and Q DACs) can be used for low power. The RX architecture can use low pass IQ sigma delta ADCs (for example, IQ CT-SD ADCs), which need to accommodate the DPD expansion bandwidth (unlike the traffic TX and RX), with a corresponding oversampling clock.

TX and RX architectures based on ZIF (and LIF or IF) are subject to IQ mismatch impairments that cause unwanted images that need to be corrected by adaptive QMC. An additional source of IQ sideband image is TX LO leakage. These TX signal impairments can be estimated based on transmit signal data captured by the AUX RX, and used to provide real time impairment compensation/correction in the TX signal chain.

FIG. 1 illustrates an RF transceiver 10, including a transmitter 20, an auxiliary (feedback) receiver 30, and a (traffic) receiver 40. The transmitter is illustrated by a transmitter analog chain including IQ DACs 21IQ, clocked by DCLO, IQ filtering 23IQ, and IQ mixers 25IQ that upconvert (RFLO) the transmit baseband to TX RF. The TX RF is buffered 27 for input to the PA, which outputs TX RF to the antenna(s) (not shown). The transmitter digital chain (not shown) can be designed provide transmit impairment compensation/correction. For example, DPD can be used to linearize the PA, compensating for PA nonlinearities by pre-distorting the TX RF signal. In addition to PA nonlinearities, other transmit chain impairments, including LO leakage and IQ mismatch in the IQ mixers, which can be corrected or compensated for based on transmit signal data captured by the auxiliary receiver and used for transmit impairment estimation and compensation/correction.

The auxiliary receiver 30 receives loopback TX RF as input 31 RX, which is downconverted in the receiver analog chain, and converted back to digital baseband. The auxiliary receiver 30 analog chain includes IQ DSAs 33IQ, and complex IQ mixers 35IQ to downconvert (AUX LO) the TX RF to baseband. The baseband TX is buffered/filtered 37IQ for input to IQ CT-SD ADCs 39IQ, clocked by AUXDCLO, for conversion to baseband digital for input to the receiver digital chain for generation of corresponding transmit signal data that can be used for TX impairment estimation and compensation/correction.

IQ image impairments in the auxiliary receiver analog chain (IQ mixers 35IQ, IQ filters 37IQ and IQ ADCs 39IQ)) can also corrupt the TX RF path (TX impairment estimation). DC offset in the auxiliary receiver can corrupt TX LO leakage estimation. Also, since auxiliary receiver path needs 3×-5× more bandwidth to accommodate DPD bandwidth expansion, the CT-SD ADCs need a correspondingly higher oversampling clock (compared to the traffic TX and RX). Also, to accurately estimate RF LO leakage to differentiate it from TX RFLO leakage, the receiver mixer LO is commonly offset compared to the TX mixer RFLO frequency, requiring an additional PLL/clock synthesizer to generate the offset LO clock.

Figure 2:
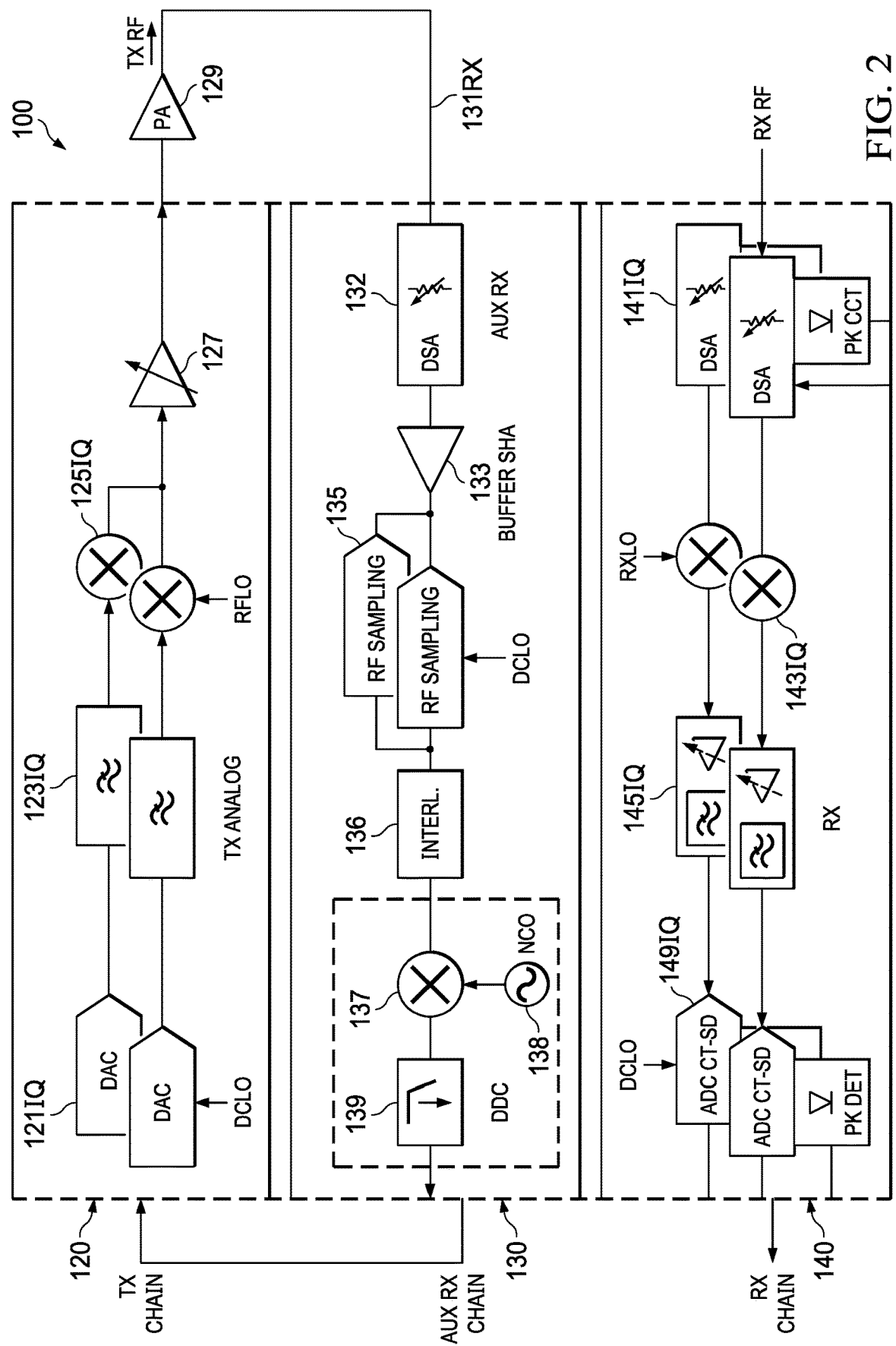
FIG. 2 illustrates an example RF TX/RX transceiver 100, including a TX 120, RX 140, and an RF direct sampling AUX RX 130 according to the Disclosure, to capture transmit signal data for use by the transmitter to compensate or correct for transmission signal impairments, such as DPD compensation for PA nonlinearities.

FIG. 2 illustrates an example RF TX/RX transceiver 100, including an RF (direct) sampling auxiliary receiver AUX RX according to the Disclosure, to capture transmit signal data for use by the transmitter to compensate or correct for transmission signal impairments, such as DPD compensation for PA nonlinearities.

The example transceiver 100 includes a TX 120, AUX RX 130, and RX 140. For each, the analog chain is illustrated, and for the AUX RX the analog chain and part of the digital chain. Alternately, the TX and RX can be implemented as separate ICs, the TX including an integrated AUX RX.

The example TX uses a ZIF architecture for low power operation. The TX analog chain 120 includes IQ DACs 121IQ, clocked by DCLO, IQ filtering 123IQ, and IQ mixers 125IQ that upconvert (RFLO) the transmit analog to TXRF. The TXRF is buffered 127 for input to the PA, which outputs TXRF to the antenna(s) (not shown). The TX can be based on any technology, including ZIF, LIF and IF, that exhibits transmit signal impairments, such as PA nonlinearities, IQ mismatch, and LO leakage.

The example RX also uses a ZIF architecture for low power operation. The RX analog chain 140 includes input IQ DSAs 141IQ, and complex IQ mixers 143IQ (RXLO) that downconvert the RX RF signal to analog baseband. The downconverted RX baseband is amplified/filtered 145IQ, and input to IQ CT-SD ADCs 149IQ, providing inherent anti-aliasing. The IQ CT-SD ADCs generate RX digital baseband for signal processing in the RX digital chain.

AUX RX 130 is based on an RF (direct) sampling architecture, according to the Disclosure. The example AUX RX 30 signal chain includes an input DSA 132, followed by a buffer SHA 133, providing input to a real RF sampling ADC 135, clocked by the DCLO used to clock the IQ TX DACs 121IQ. SHA 133 maintains input to the RF sampling ADC during conversion.

The example RF sampling ADC is a dual-channel interleaved ADC 135, followed by an interleaving correction block 136 (analog and/or digital). The RF sampling ADC 135 is followed by DDC 137 with a complex NCO 138 per ADC channel. A decimation filter 139 decreases the sample rate by a factor of N (dropping samples) after suppressing the aliasing bands by digital filtering. The resulting digital baseband data stream is used to generate TX signal data for use by the TX to compensate or correct for transmit signal impairments, including, for example, adaptive TX DPD PA linearization, and adaptive correction for TX IQ mismatch compensation (QMC) and TX RFLO leakage.

The RF direct sampling architecture for the AUX RX uses a real ADC, which in one example can be interleaved, in place of complex IQ baseband ADCs, eliminating the analog mixer at the frontend, as well as an additional LO PLL/synthesizer for the AUX RX signal chain. DDC (NCO) can be accomplished with zero frequency error with the TX RFLO. DDC/NCO discrete mixing can be used to match the continuous time TX RFLO mixer frequency, including equivalent folded frequency generation (such as for 2nd, 3rd, 4th Nyquist bands). A fractional DDC/NCO digital mixer can be used to track a TX fractional RFLO with zero frequency offset.

Dual band capability can be implemented with a single AUX RX chain, including a single RF sampling ADC, with different DDC/NCO digital mixers, that are time-multiplexed, while maintaining phase coherence without the need of separate PLL/synthesizers. For example, a transceiver with a 4-channel TX can_be configured as a first set of 2-channel transmit for band RFLO1, and a second set of 2-channel transmit for band RFLO2, A single AUX RX, including a single RF sampling ADC, can then be time-multiplexed between the two bands (RFLO1 and RFLO2) based on switching the DDC/NCO mixers.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. A circuit comprising:
a transmitter including digital and analog signal chains, to output from the analog signal chain transmit radio frequency (RF) signals based on digital baseband signals input from the digital signal chain, the transmitter including:
analog signal chain elements that introduce transmit signal impairments in the digital signal chain to compensate or correct for the transmit signal impairments, based on transmit signal data derived from the transmit RF signals; and
an auxiliary receiver to receive loopback transmit RF signals, the auxiliary receiver including:
an RF direct sampling analog-to-digital converter (ADC) to convert the loopback transmit RF signals to digital transmit RF signals,
digital down conversion circuitry to downconvert the digital transmit RF signals to captured digital transmit baseband signals, and
data capture circuitry to generate the transmit signal data based on the captured digital transmit baseband signals;
wherein:
the transmitter is configured to transmit first band and second band transmit RF signals; and
the auxiliary receiver is configured to receive corresponding loopback first band and loopback second band transmit RF signals, and is configured with:
the digital down conversion circuitry configured with first and second digital mixers that are time-multiplexed between the first band and the second band transmit RF signals.

2. The circuit of claim 1, wherein the transmit signal impairments include at least one of: power amplifier non-linearity, in-phase and quadrature (I and Q) signal mismatch, and local oscillator leakage.

3. The circuit of claim 1, wherein the digital downconversion circuitry includes a numerical controlled oscillator.

4. The circuit of claim 1, wherein the circuit further comprises a receiver integrated with the transmitter and the auxiliary receiver, as a transceiver.

5. A transceiver circuit comprising:
a transmitter including digital and analog signal chains, to output from the analog signal chain transmit radio frequency (RF) signals based on digital baseband signals input from the digital signal chain, the transmitter including:
analog signal chain elements that introduce transmit signal impairments;
an auxiliary receiver to receive loopback transmit RF signals, the auxiliary receiver including:
an RF direct sampling analog-to-digital converter (ADC) to convert the loopback transmit RF signals to digital transmit RF signals,
digital down conversion circuitry to downconvert the digital transmit RF signals to captured digital transmit baseband signals, and
data capture circuitry to generate the transmit signal data based on the captured digital transmit baseband signals; and
a receiver including analog and digital signal chains, to receive through the analog signal chain received RF signals, and to convert the received RF signals to digital baseband signals;
wherein:
the transmitter is configured as a dual band transmitter to transmit first band and second band transmit RF signals; and
the auxiliary receiver is configured to receive corresponding loopback first band and loopback second band transmit RF signals, and is configured with:
the digital down conversion circuitry configured with first and second digital mixers that are time-multiplexed between the first band and the second band transmit RF signals.

6. The circuit of claim 5, wherein the transmit signal impairments include at least one of: power amplifier non-linearity, in-phase and quadrature (I and Q) signal mismatch, and local oscillator leakage.

7. The circuit of claim 5, wherein the digital downconversion circuitry includes a numerical controlled oscillator.

8. A method comprising:
generating transmit radio frequency (RF) signals based on digital baseband signals, in a transmitter with digital and analog signal chains, the analog signal chain introducing transmit signal impairments;
in the digital signal chain, compensating or correcting for the transmit signal impairments based on transmit signal data derived from the transmit RF signals;
receiving loopback transmit RF signals in an auxiliary receiver, and:
converting the loopback transmit RF signals to digital transmit RF signals in an RF direct sampling analog-to-digital converter (ADC),
downconverting the digital transmit RF signals to captured digital transmit baseband signals,
generating the transmit signal data based on the captured digital transmit baseband signals;

transmitting first band and second band transmit RF signals;
receiving loopback first band and second band transmit RF signals; and
performing digital down conversion using first and second digital mixers that are time-multiplexed between the first band and the second band transmit RF signals.

9. The method of claim 8, wherein the transmit signal impairments include at least one of: power amplifier nonlinearity, in-phase and quadrature (I and Q) signal mismatch, and local oscillator leakage.

10. The method of claim 8, wherein the transmit signal impairments include power amplifier nonlinearity, and further comprising:
digitally pre-distorting the digital baseband signals; and
generating transmit signal data for use in estimating power amplifier nonlinearity signal impairment, and adapting digitally pre-distorting the digital baseband signals based on the estimated power amplifier nonlinearity.

11. The method of claim 8, wherein the digital downconversion uses a numerical controlled oscillator.

* * * * *